(12) United States Patent
Wu et al.

(10) Patent No.: US 9,325,309 B2
(45) Date of Patent: Apr. 26, 2016

(54) GATE DRIVING CIRCUIT AND DRIVING METHOD THEREOF

(71) Applicant: Novatek Microelectronics Corp., Hsinchu (TW)

(72) Inventors: Tse-Hung Wu, New Taipei (TW); Yen-Po Chen, Nantou County (TW)

(73) Assignee: Novatek Microelectronics Corp., Hsinchu (TW)

(*) Notice: Subject to any disclaimer, the term of this patent is extended or adjusted under 35 U.S.C. 154(b) by 95 days.

(21) Appl. No.: 14/454,736

(22) Filed: Aug. 8, 2014

(65) Prior Publication Data

US 2015/0318849 A1 Nov. 5, 2015

(30) Foreign Application Priority Data

Apr. 30, 2014 (TW) .............................. 103115592 A

(51) Int. Cl.
*H03K 17/28* (2006.01)
*H03K 17/00* (2006.01)

(52) U.S. Cl.
CPC .............. *H03K 17/28* (2013.01); *H03K 17/002* (2013.01); *H03K 2217/0054* (2013.01)

(58) Field of Classification Search
CPC ............................. H03K 17/28; H03K 17/002
USPC ......................................................... 326/62
See application file for complete search history.

(56) References Cited

U.S. PATENT DOCUMENTS

| 7,466,312 | B2 | 12/2008 | Choi et al. |
|---|---|---|---|
| 7,633,481 | B2 | 12/2009 | Kim et al. |
| 7,864,074 | B2* | 1/2011 | Sun ...................... G09G 3/3283 341/1 |
| 8,044,913 | B2 | 10/2011 | Kuo et al. |
| 8,253,679 | B2 | 8/2012 | Kim et al. |
| 2005/0104647 | A1 | 5/2005 | Choi et al. |
| 2006/0227095 | A1 | 10/2006 | Kim et al. |
| 2008/0231582 | A1 | 9/2008 | Kuo et al. |
| 2010/0060619 | A1 | 3/2010 | Kim et al. |
| 2012/0050244 | A1* | 3/2012 | Chu ...................... G09G 3/3677 345/211 |
| 2012/0113070 | A1 | 5/2012 | Wang et al. |
| 2012/0293762 | A1* | 11/2012 | Shin ...................... G09G 3/3677 349/139 |

FOREIGN PATENT DOCUMENTS

| TW | I259434 | 8/2006 |
|---|---|---|
| TW | 200636647 | 10/2006 |
| TW | I381343 | 1/2013 |
| TW | I417824 | 12/2013 |

OTHER PUBLICATIONS

"Office Action of Taiwan Counterpart Application", issued on Nov. 20, 2015, p. 1-p. 5, in which the listed references were cited.

* cited by examiner

*Primary Examiner* — Dylan White
(74) *Attorney, Agent, or Firm* — Jianq Chyun IP Office

(57) ABSTRACT

A gate driving circuit and a driving method thereof are provided. The gate driving circuit includes a control signal generator and at least one gate channel set, each of the at least one gate channel set includes a plurality of gate channels, and the plurality of gate channels share a level shifter. The driving method includes generating a plurality of first control signals and a plurality of second control signals according to a gate driver start pulse, and determining that one of the gate channels uses the level shifter during a time period according to the plurality of first control signals and the plurality of second control signals. Therefore, the number of the level shifters can be decreased.

19 Claims, 13 Drawing Sheets

GATE DRIVING CIRCUIT AND DRIVING METHOD THEREOF

CROSS-REFERENCE TO RELATED APPLICATION

This application claims the priority benefit of Taiwan application serial no. 103115592, filed on Apr. 30, 2014. The entirety of the above-mentioned patent application is hereby incorporated by reference herein and made a part of this specification.

BACKGROUND

1. Technical Field

The invention relates to a display, and particularly relates to a gate driving circuit and a driving method thereof.

2. Related Art

A gate driving circuit 100 is used for driving gates of all transistors on each scan line of a display panel, and a typical circuit structure thereof is as shown in FIG. 1. In FIG. 1, only four gate channels ch_1-ch_4 in n gate channels of the gate driving circuit 100 are illustrated, where each gate channel includes a shift register, a logic unit, a level shifter and an output buffer. When an image frame is to be displayed on the display panel (not shown), a timing controller (not shown) outputs a gate driver start pulse GDSP to the gate driving circuit 100. The shift register 121 of the gate channel ch_1 reads the gate driver start pulse GDSP, and generates a delay start pulse g1 to the logic unit 141, and transmits the gate driver start pulse GDSP to the shift register 122 of a next stage. Operations of the other shift register 122-124 can be deduced with reference of the operation of the shift register 121. Therefore, the shift registers 121-124 can determine a driving sequence of each scan line (not shown) of the display panel and sequentially generate the delay start pulses g1-g4, and respectively transmit the delay start pulses g1-g4 to the logic units 141-144. The logic units 141-144 may generate first signals LVS1-LVS4 under control of an output enable signal OE, and transmit the first signals LVS1-LVS4 to the level shifters 161-164 for voltage level processing. Voltage level processed driving signals HVS1-HVS4 respectively drive the gates of the transistors (not shown) on different scan lines of the display panel through the output buffers 181-184. Therefore, according to FIG. 1, it is known that after the typical gate driving circuit 100 receives the gate driver start pulse GDSP, the first signals LVS1-LVS4 are sequentially transmitted through the shift register of each channel.

Each gate channel (for example, the gate channels ch_1-ch_4 shown in FIG. 1) in the typical gate driving circuit 100 includes a level shifter to convert the received first signal into a high voltage signal for outputting. However, when the number of the gate channels is increased, the number of the level shifters are also increased, and the cost of the gate driving circuit is accordingly increased.

SUMMARY

The invention is directed to a gate driving circuit and a driving method thereof, by which a number of level shifters used in the gate driving circuit, is effectively decreased.

An embodiment of the invention provides a gate driving circuit including a control signal generator and at least one first gate channel set. The control signal generator is used for receiving a gate driver start pulse to generate a plurality of first control signals and a plurality of second control signals. The at least one first gate channel set is coupled to the control signal generator. Each of the at least one first gate channel set includes a plurality of first gate channels, and the first gate channels are controlled by the first control signals and the second control signals to share a first level shifter, and generate a plurality of gate driving signals.

In an embodiment of the invention, each of the at least one first gate channel set includes a plurality of front end channels, the first level shifter and a plurality of post end channels. A driving signal output terminal of each of the front end channels is coupled to an input terminal of the first level shifter, where the front end channels are connected in series to respectively receive an output pulse signal of a previous stage front end channel in the front end channels, and each of the front end channels is controlled by one of the first control signals to determine whether to output a first signal to the input terminal of the first level shifter. An input terminal of each of the post end channels is coupled to an output terminal of the first level shifter, where each of the post end channels is controlled by one of the second control signals to determine whether to generate one of the gate driving signals according to an output signal of the first level shifter.

In an embodiment of the invention, under control of the second control signals, one of the post end channels receives the output signal of the first level shifter to correspondingly generate one of the gate driving signals, and the other post end channels hold the other gate driving signals to a voltage level.

In an embodiment of the invention, each of the front end channels includes a shift register, a logic unit and a first switch. The shift register receives the output pulse signal from the previous stage front end channel to generate a first delay start pulse. An input terminal of the logic unit is coupled to the shift register for receiving the first delay start pulse. The logic unit performs a logic operation and generates the first signal according to an output enable signal come from external. A first terminal of the first switch is coupled to an output terminal of the logic unit for receiving the first signal. A second terminal of the first switch is coupled to the input terminal of the first level shifter, where the first switch is controlled by a corresponding one of the first control signals.

In an embodiment of the invention, each of the front end channels includes a shift register, a logic unit and a first switch. The shift register receives the output pulse signal from the previous stage front end channel to generate a first delay start pulse. A first terminal of the first switch is coupled to the shift register for receiving the first delay start pulse, where the first switch is controlled by a corresponding one of the first control signals to output the first delay start pulse to serve as a second delay start pulse. An input terminal of the logic unit is coupled to a second terminal of the first switch for receiving the second delay start pulse. An output terminal of the logic unit is coupled to the input terminal of the first level shifter, where the logic unit performs a logic operation to the second delay start pulse to generate the first signal according to an output enable signal come from external.

In an embodiment of the invention, each of the front end channels includes a shift register and a logic unit. The shift register receives the output pulse signal from the previous stage front end channel to generate a first delay start pulse. An input terminal of the logic unit is coupled to the shift register for receiving the first delay start pulse. An output terminal of the logic unit is coupled to the input terminal of the first level shifter, where the logic unit performs a logic operation to the first delay start pulse to generate the first signal according to an output enable signal come from external, and the logic unit is controlled by a corresponding one of the first control signals to determine whether to output the first signal.

In an embodiment of the invention, each of the front end channels includes a shift register and a first switch. The shift register receives the output pulse signal from the previous stage front end channel to generate the first signal. A first terminal of the first switch is coupled to the shift register for receiving the first signal. A second terminal of the first switch is coupled to the input terminal of the first level shifter, where the first switch is controlled by a corresponding one of the first control signals.

In an embodiment of the invention, each of the post end channels includes a second switch and a driving voltage holding circuit. A first terminal of the second switch is coupled to the output terminal of the first level shifter, where the second switch is controlled by a corresponding one of the second control signals. An output terminal of the driving voltage holding circuit is coupled to a second terminal of the second switch. When the second switch is turned off, the driving voltage holding circuit holds a corresponding one of the gate driving signals to a voltage level. When the second switch is turned on, the second switch outputs the output signal of the first level shifter to serve as the corresponding one of the gate driving signals.

In an embodiment of the invention, the driving voltage holding circuit includes a voltage source and a third switch. A first terminal of the third switch is coupled to the second terminal of the second switch, and a second terminal of the third switch is coupled to the voltage source, where the third switch is control by an inverted signal of the corresponding one of the second control signals.

In an embodiment of the invention, the driving voltage holding circuit includes a voltage source and a capacitor. A first end of the capacitor is coupled to the second terminal of the second switch, and a second end of the capacitor is coupled to the voltage source.

In an embodiment of the invention, each of the post end channels further includes an output buffer. An input terminal of the output buffer is coupled to the second terminal of the second switch.

In an embodiment of the invention, the output buffer includes at least one inverter.

In an embodiment of the invention, the control signal generator includes a plurality of flip-flops, an OR gate and a plurality of third level shifters. A first input terminal of the OR gate receives the gate driver start pulse. The flip-flops are used for generating the first control signals. A clock terminal of each of the flip-flops receives a clock signal. An input terminal of a first stage flip-flop of the flip-flops is coupled to an output terminal of the OR gate. An input terminal of each of the flip-flops except the first stage flip-flop is coupled to an output terminal of a previous stage flip-flop of the flip-flops, where a second input terminal of the OR gate is coupled to an output terminal of a last stage flip-flop of the flip-flops. An input terminal of each of the third level shifters is coupled to the output terminal of a corresponding one of the flip-flops to generate one of the second control signals.

An embodiment of the invention provides a driving method of a gate driving circuit, and the driving method includes following steps. A plurality of first control signals and a plurality of second control signals are generated according to a gate driver start pulse, and a plurality of first gate channels of a first gate channel set are determined to share a first level shifter in time-division according to the first control signals and the second control signals, so as to generate a plurality of gate driving signals.

In an embodiment of the invention, when one of the first gate channels uses the first level shifter during a time period, the gate driving signal of each of the other first gate channels is held to a voltage level.

According to the above descriptions, in the gate driving circuit and the driving method thereof, under control of the first control signals and the second control signals, a plurality of the first gate channels share one first level shifter, so as to decrease a number of the first level shifters in the gate driving circuit.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
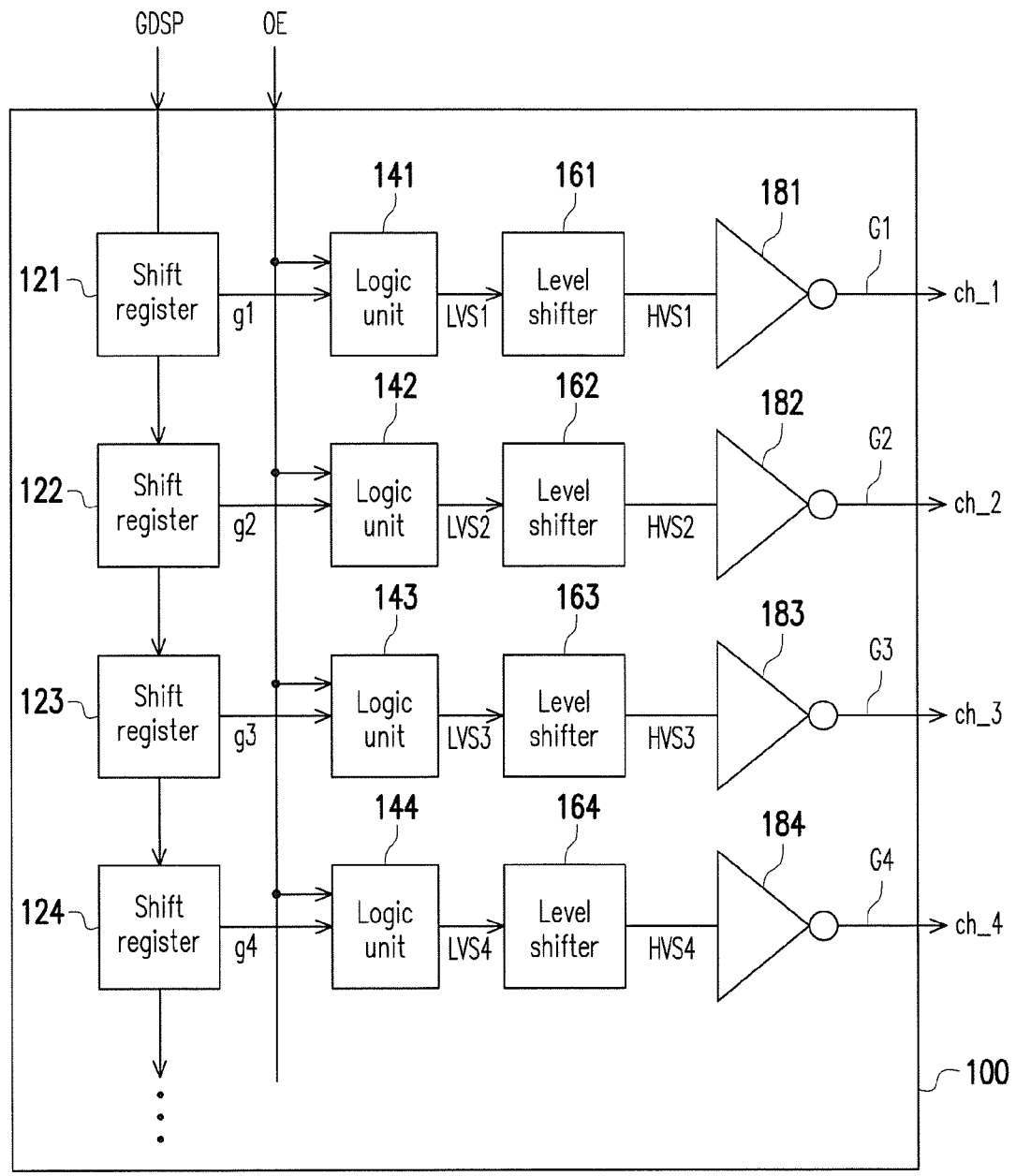
FIG. 1 is a circuit schematic diagram of a conventional gate driving circuit.

A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, wherever possible, components/members/steps using the same referential numbers in the drawings and description refer to the same or like parts. Components/members/steps using the same referential numbers or using the same terms in different embodiments may cross-refer related descriptions.

Figure 2:
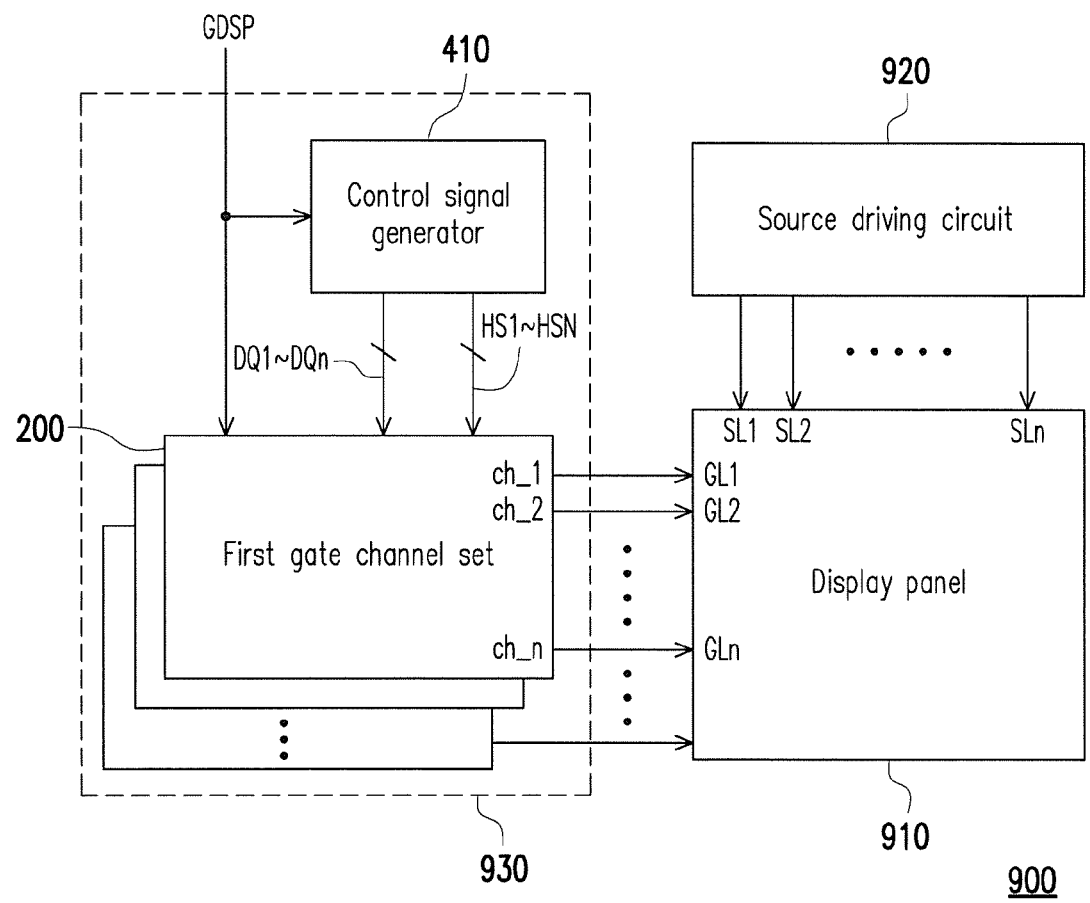
FIG. 2 is a schematic diagram of display system using a gate driving circuit according to an embodiment of the invention.

Referring to FIG. 2, FIG. 2 is a schematic diagram of display system using a gate driving circuit 930 according to an embodiment of the invention. The display system 900 includes a display panel 910, a source driving circuit 920 and the gate driving circuit 930. The source driving circuit 920 and the gate driving circuit 930 are coupled to the display panel for respectively driving a plurality of source lines (SL1, SL2, . . . , SLn shown in FIG. 2) and a plurality of gate lines (GL1, GL2, . . . , GLn shown in FIG. 2). The gate driving circuit 930 includes a control signal generator 410 and a plurality of gate channels. The gate channels may respectively drive different gate lines (or scan lines) of the display panel 910.

In order to decrease a number of level shifters used in the gate driving circuit 930, the gate channels of the gate driving circuit 930 can be grouped into one or a plurality of sets (which is referred to as a gate channel set hereinafter). Each of the gate channel set 200 includes a plurality of gate channels ch_1, ch_2, . . . , ch_n. The number n of the gate channels included in the gate channel set 200 can be determined according to an actual design requirement. The control signal generator 410 receives a gate driver start pulse GDSP to generate a plurality of first control signals DQ1-DQn and a plurality of second control signals HS1-HSN. According to the first control signals DQ1-DQn and the second control signals HS1-HSN, the gate channels ch_1-ch_n of each first gate channel set 200 may share one level shift in time-division. In this way, the number of the level shifters used in the gate driving circuit 930 including the at least one first gate channel set 200 can be decreased.

Figure 3A:
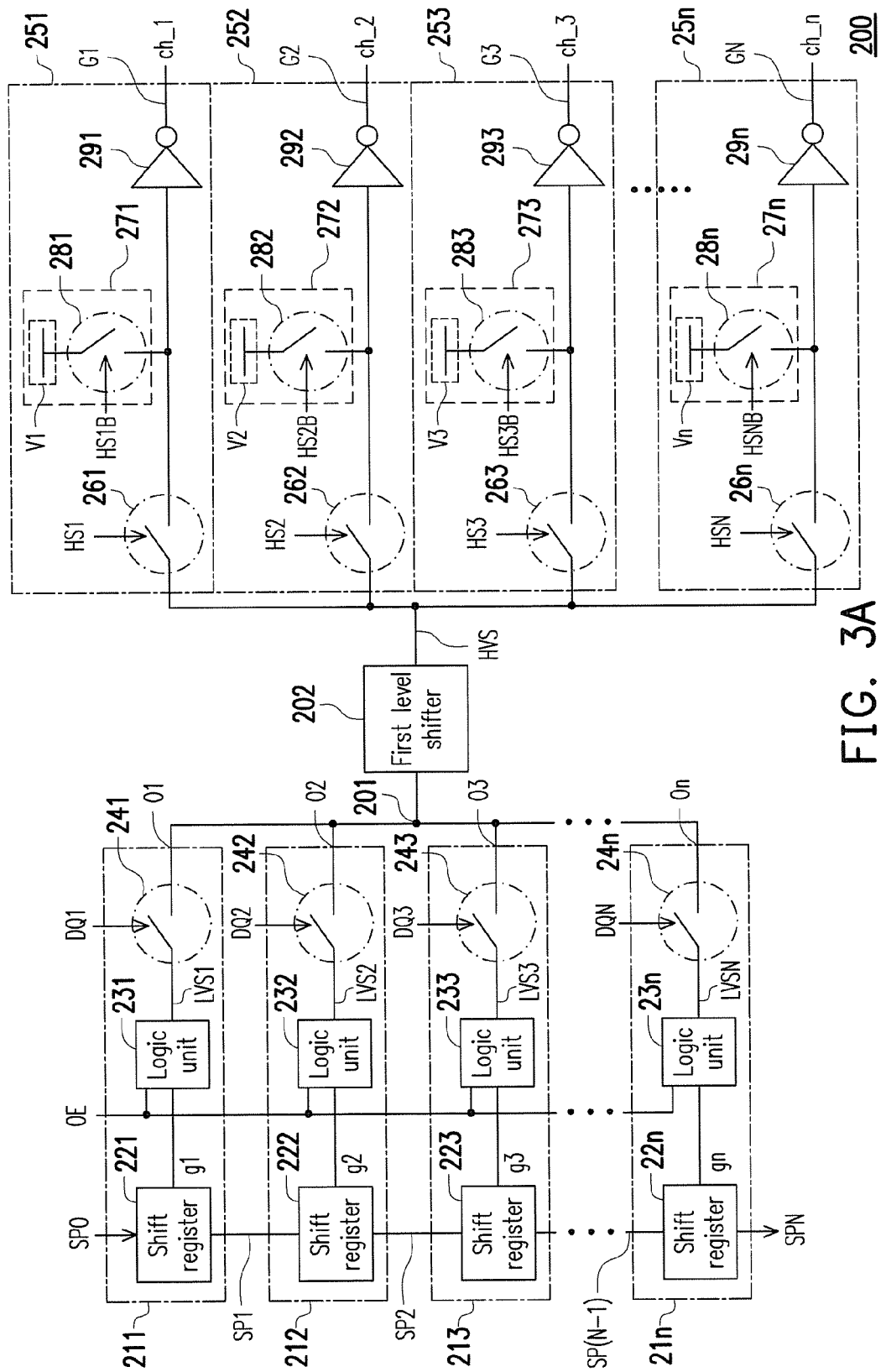
FIG. 3A is a circuit schematic diagram of a first gate channel set according to an embodiment of the invention.

Referring to FIG. 3A, FIG. 3A is a circuit schematic diagram of the first gate channel set 200 of FIG. 2 according to an embodiment of the invention. According to FIG. 3A, it is known that the first gate channel set 200 has N-stage gate channels ch_1, ch_2, ch_3, . . . , ch_n, and the N-stage gate channels ch_1-ch_n share a first level shifter 202, where the gate channel ch_1 includes a front end channel 211, the first level shifter 202 and a post end channel 251, the gate channel ch_2 includes a front end channel 212, the first level shifter 202 and a post end channel 252, the gate channel ch_3 includes a front end channel 213, the first level shifter 202 and a post end channel 253, and the gate channel ch_n includes a front end channel 21n, the first level shifter 202 and a post end channel 25n.

The front end channels 211-21n shown in FIG. 3A are connected in parallel to each other, and a plurality of driving signal output terminals O1, O2, O3, . . . , On of the front end channels 211-21n are all coupled to a same node 201. Each of the front end channels receives an output pulse signal generated by the previous stage front end channel to generate a first signal, and determines whether to output the first signal to an input terminal of the first level shifter 202 under control of one of the first control signals. For easier understanding, further descriptions are presented below. For example, the front end channel 211 of the gate channel ch_1 receives an output pulse signal SP0 of the previous stage front end channel (not shown) to generate a first signal LVS1 and an output pulse signal SP1, and determines whether to output the first signal LVS1 to the input terminal of the first level shifter 202 under control of the first control signal DQ1, where the output pulse signal SP0 can be the gate driver start pulse GDSP or an output pulse signal SPN come from a previous gate channel set. The front end channel 212 of the gate channel ch_2 receives the output pulse signal SP1 of the previous stage front end channel (the front end channel 211) to generate a first signal LVS2 and an output pulse signal SP2, and determines whether to output the first signal LVS2 to the input terminal of the first level shifter 202 under control of the first control signal DQ2. The front end channel 213 of the gate channel ch_3 receives the output pulse signal SP2 of the previous stage front end channel (the front end channel 212) to generate a first signal LVS2 and an output pulse signal, and determines whether to output the first signal LVS3 to the input terminal of the first level shifter 202 under control of the first control signal DQ3. Deduced by analogy, the front end channel 21n of the gate channel ch_n receives the output pulse signal SP(N−1) of the previous stage front end channel (not shown) to generate a first signal LVSN and an output pulse signal SPN, and determines whether to output the first signal LVSN to the input terminal of the first level shifter 202 under control of the first control signal DQN.

As shown in FIG. 3A, the input terminal of the first level shifter 202 is coupled to the node 201. An output terminal of the first level shifter 202 is coupled to input terminals of the post end channels 251-25n. The first level shifter 202 receives the first signal on the node 201 and boosts the same to generate a high voltage signal HVS for transmitting to the input terminals of the post end channels 251-25n.

The post end channels 251-25n shown in FIG. 3A are used for generating a plurality of gate driving signals G1, G2, G3, . . . , GN. Under control of a plurality of second control signals HS1, HS2, HS3, . . . , HSN, one of the post end channels 251-25n can determine whether to generate one of the gate driving signals G1-GN according to the high voltage signal HVS of the first level shifter 202, and the other gate driving signals are held to a voltage level. In detail, the post end channel 251 of the gate channel ch_1 determines whether to output the high voltage signal HVS to the display panel 910 to serve as the gate driving signal G1 under control of the second control signal HS1. The post end channel 252 of the gate channel ch_2 determines whether to output the high voltage signal HVS to the display panel 910 to serve as the gate driving signal G2 under control of the second control signal HS2. The post end channel 253 of the gate channel ch_3 determines whether to output the high voltage signal HVS to the display panel 910 to serve as the gate driving signal G3 under control of the second control signal HS3. Deduced by analogy, the post end channel 25n of the gate channel ch_n determines whether to output the high voltage signal HVS to the display panel 910 to serve as the gate driving signal GN under control of the second control signal HSN.

In some embodiment, the front end channels 211-21n shown in FIG. 3A may substantially have the same (or similar) structure and functions. In an embodiment of the invention, the front end channel 211 includes a shift register 221, a logic unit 231 and a first switch 241. The shift register 221 receives the output pulse signal SP0 from the previous stage front end channel (not shown) to generate the first delay start pulse g1 and the output pulse signal SP1. The logic unit 231 receives the first delay start pulse g1. The logic unit 231 performs a logic operation according to an output enable signal OE come from external and generates the first signal LVS1. In an embodiment of the invention, the logic unit 231 can be implemented by an NAND gate, a transmission gate, or other switch circuits, though the invention is not limited thereto. For example, it is assumed that the NAND gate is used to implement the logic unit 231, a first input terminal and a second input terminal of the NAND gate can respectively receive the output enable signal OE and the first delay start pulse g1, and an output terminal of the NAND gate outputs the first signal LVS1. The first switch 241 is controlled by one of the first control signals DQ1 to determine a turning on/off state of the first switch 241. When the first switch 241 is turned on, the first signal LVS1 can be transmitted to the input terminal of the first level shifter 202.

The front end channel 212 includes a shift register 222, a logic unit 232 and a first switch 242. The front end channel 213 includes a shift register 223, a logic unit 233 and a first switch 243. The front end channel 21n includes a shift register 22n, a logic unit 23n and a first switch 24n. Implementations of the front end channels 212-21n can be deduced by referring to above descriptions of the front end channel 211, and details thereof are not repeated.

In some embodiment, the post end channels 251-25n shown in FIG. 3A may substantially have the same (or similar) structure and functions. In an embodiment of the invention, the post end channel 251 includes a second switch 261, a driving voltage holding circuit 271 and an output buffer 291. A first terminal of the second switch 261 is coupled to the output terminal of the first level shifter 202 for receiving the high voltage signal HVS. A control terminal of the second switch 261 is controlled by the second control signal HS1 to determine a turning on/off state of the second switch 261. The driving voltage holding circuit 271 is coupled to a second terminal of the second switch 261. An input terminal of the output buffer 291 is coupled to the second terminal of the second switch 261, and an output terminal of the output buffer 291 is coupled to one of the gate lines of the display panel 910. When the second switch 261 is turned off, the driving voltage holding circuit 271 can hold the gate driving signal G1 to a voltage level. When the second switch 261 is turned on, the output buffer 291 can receive the high voltage signal HVS from the first level shifter 202 to generate the first gate driving signal G1. Namely, the second switch 261 can output the output signal of the first level shifter 202 to the output buffer 291 to serve as the gate driving signal G1.

In different embodiments of the invention, the driving voltage holding circuit 271 can be implemented in multiple ways. In the embodiment of FIG. 3A, the driving voltage holding circuit 271 may include a third switch 281 and a voltage source V1. A first terminal and a second terminal of the third switch 281 are respectively coupled to the voltage source V1 and the second terminal of the second switch 261. The third switch 271 is controlled by an inverted signal HS1B of a corresponding one of the second control signals. Namely, when the second switch 261 is turned on, the third switch 281 is turned off, such that the output buffer 291 can receive the high voltage signal HVS of the first level shifter 202 to generate the gate driving signal G1. Conversely, when the second switch 261 is turned off, the third switch 281 is turned on, and the output buffer 291 receives a voltage signal of the voltage source V1 to hold the gate driving signal G1 to a voltage level. Moreover, the voltage level of the voltage source V1 can be determined according to an actual requirement. For example, the voltage source V1 can be an operation voltage source (a system voltage source) or a ground voltage source.

In other embodiments, the third switch 281 can also be replaced by a capacitor. If the capacitor is used to replace the third switch 281, a first terminal and a second terminal of the capacitor are respectively coupled to the voltage source V1 and the second terminal of the second switch 261. The voltage source V1 can be the voltage source, the ground voltage source or any other fixed reference voltage.

Moreover, in another embodiment of the invention, the output buffer 291 of the post end channel 251 includes at least one inverter, though the invention is not limited thereto. For example, in another embodiment of the invention, the output buffer 291 of the post end channel 251 can also be omitted. In other embodiments, the inverter of the output buffer 291 shown in FIG. 2A can also be replaced by a buffer, a unit gain buffer or other gain circuits.

The post end channel 252 includes a second switch 262, a driving voltage holding circuit 272 and an output buffer 292. The post end channel 253 includes a second switch 263, a driving voltage holding circuit 273 and an output buffer 293. The post end channel 25n includes a second switch 26n, a driving voltage holding circuit 27n and an output buffer 29n. Implementations of the post end channels 252-25n can be deduced by referring to the aforementioned descriptions of the post end channel 251, which are not repeated.

Figure 3B:
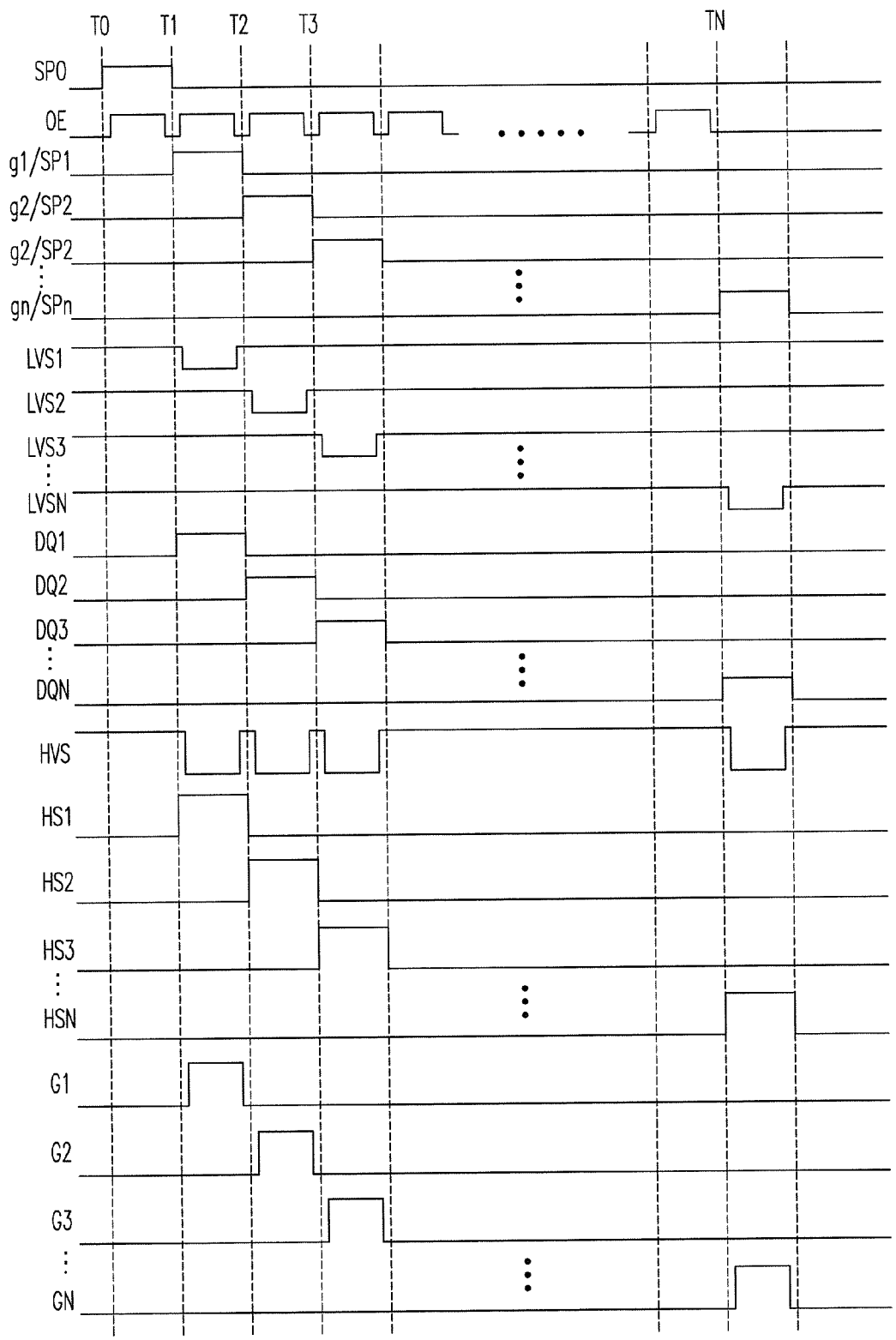
FIG. 3B is a timing schematic diagram of the gate driving circuit of FIG. 3A.

FIG. 3B is a timing schematic diagram of the gate driving circuit of FIG. 3A. Referring to FIG. 3A and FIG. 3B, at a time point T0, the gate channel ch_1 of the first gate channel set 200 receives the output pulse signal SP0 of the previous stage gate channel. The shift register 221 of the front end channel 211 of the gate channel ch_1 generates the first delay start pulse g1 and the output pulse signal SP1 at a time point T1 according to the output pulse signal SP0. The logic unit 231 receives the first delay start pulse g1 and the output enable signal OE come from external and performs a logic operation to generate the first signal LVS1. It should be noticed that during a period from the time point T1 to a time point T2, the first control signal DQ1 and the second control signal HS1 input to the gate channel ch_1 are all in an enabling state (for example, a logic high level), and the first control signals DQ2-DQN and the second control signals HS2-HSN input to the other gate channels ch_2-ch_n are all in a disabling state (for example, the logic low level), so that the first switch 241 and the second switch 261 of the gate channel ch_1 are turned on, and the third switch 281 is turned off, and the first switches 242-24n and the second switches 262-26n of the other gate channels ch_2-ch_n are turned off and the third switches 282-28n are turned on. In this way, the first level shifter 202 receives the first signal LVS1 of the gate channel ch_1 and boosts the same to generate the high voltage signal HVS to the post end channel 251 of the gate channel ch_1, and the output buffer 291 receives the high voltage signal HVS through the second switch 261 of the gate channel ch_1 to generate the gate driving signal G1. During the period from the time point T1 to the time point T2, the output buffers 292-29n respectively receive the voltage signals of the voltage sources V2-Vn to hold the gate driving signals G2-GN to a fixed voltage level (for example, the logic low level).

At the time point T2, the gate channel ch_2 of the first gate channel set 200 receives the output pulse signal SP1 of the gate channel chi. The shift register 222 of the front end channel 212 of the gate channel ch_2 generates the first delay start pulse g2 and the output pulse signal SP2 at the time point T2 according to the output pulse signal SP1, as shown in FIG. 3B. The logic unit 232 receives the first delay start pulse g2 and the output enable signal OE come from external and performs a logic operation to generate the first signal LVS2. It should be noticed that during a period from the time point T2 to a time point T3, the first control signal DQ2 and the second control signal HS2 input to the gate channel ch_2 are all in the enabling state (for example, the logic high level), and the first control signals DQ1, DQ3-DQN and the second control signals HS1, HS3-HSN input to the other gate channels ch_1, ch_3-ch_n are all in the disabling state (for example, the logic low level), so that the first switch 242 and the second switch 262 of the gate channel ch_2 are turned on, and the third switch 282 is turned off, and the first switches 241, 243-24n and the second switches 261, 263-26n of the other gate channels ch_1, ch_3-ch_n are turned off and the third switches 281, 283-28n are turned on. In this way, the first level shifter 202 receives the first signal LVS2 of the gate channel ch_2 and boosts the same to generate the high voltage signal HVS to the post end channel 252 of the gate channel ch_2, and the output buffer 292 receives the high voltage signal HVS through the second switch 262 of the gate channel ch_2 to generate the gate driving signal G2. During the period from the time point T2 to the time point T3, the output buffers 291, 293-29n respectively receive the voltage signals of the voltage sources V1, V3-Vn to hold the gate driving signals G1, G3-GN to a fixed voltage level (for example, the logic low level). The operations of the first gate channel set 200 at the time points T3-TN can be deduced with reference of the operation of the first gate channel set 200 at the time point T1 or the time point T2, which are not repeated. According to the aforementioned descriptions, it is known that under control of the first control signals DQ1-DQN and the second control signals HS1-HSN, an effect that the gate channels ch_1-ch_n share the same level shifter 202 is achieved.

Figure 4:
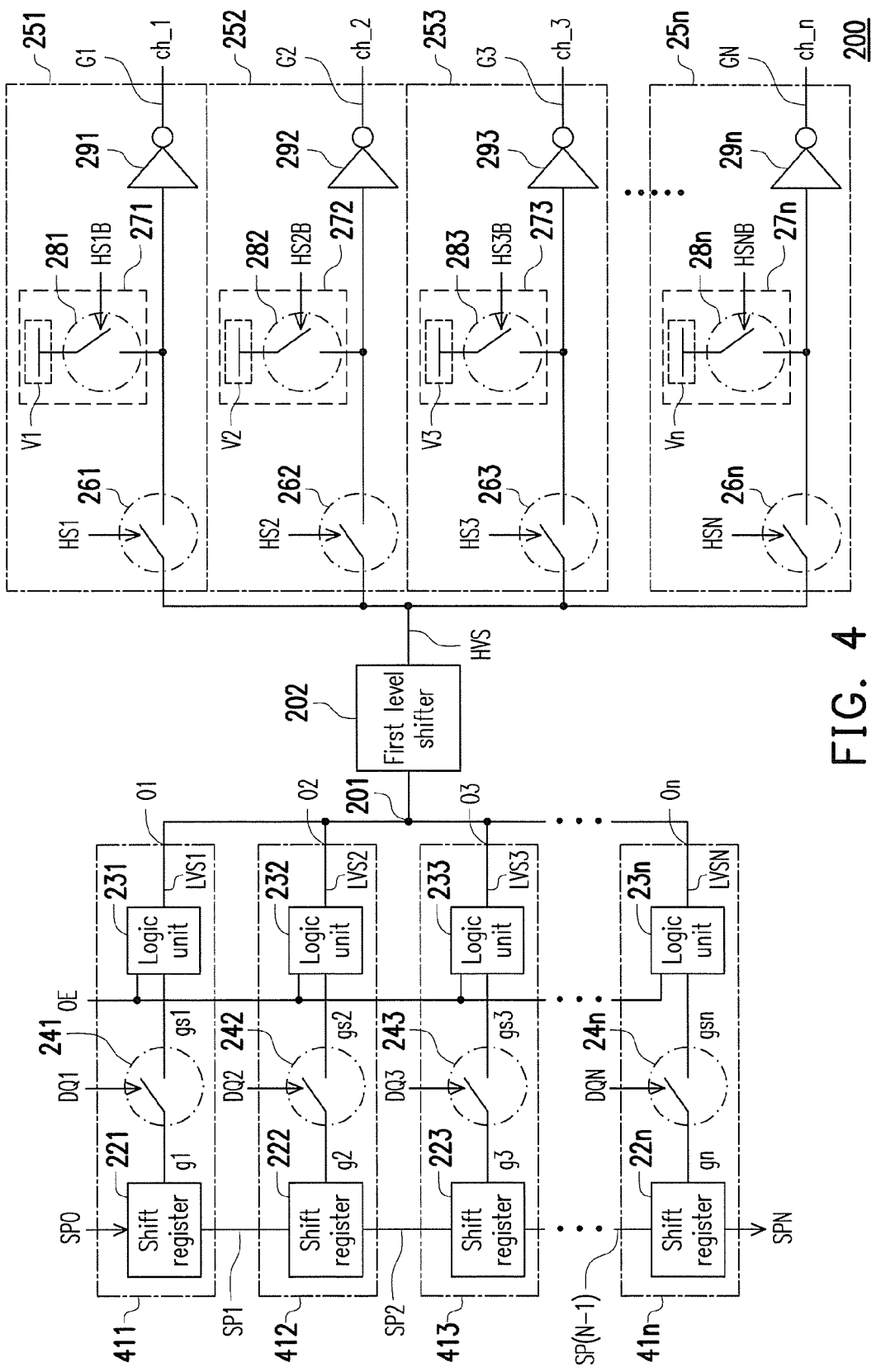
FIG. 4 is a circuit schematic diagram of a first gate channel set according to another embodiment of the invention.

Referring to FIG. 4, FIG. 4 is a circuit schematic diagram of the first gate channel set 200 of FIG. 2 according to another embodiment of the invention. The embodiment of FIG. 4 can be deduced by referring to related descriptions of FIG. 3A and FIG. 3B. Compared to FIG. 3A, positions of the logic units 231-23n and the first switches 241-24n of the front end channels 411, 412, 413, . . . , 41n of FIG. 4 are different with that of FIG. 3A. In the present embodiment, the front end channels 411-41n substantially have the same (or similar) structure and functions. In the following descriptions, only the front end channel 411 of FIG. 4 is described, and descriptions of the other front end channels 412-41n can be deduced by referring to related descriptions of the front end channel 411.

The front end channel 411 includes the shift register 221, the first switch 241 and the logic unit 231. The shift register 221 receives the output pulse signal SP0 from the previous stage front end channel (not shown) to generate the first delay start pulse g1 and the output pulse signal SP1. The first switch 241 is controlled by the first control signal DQ1 to determine whether to transmit the first delay start pulse g1 to the input terminal of the logic unit 231 to serve as a second delay start pulse gs1. The logic unit 231 receives the second delay start pulse gs1 and the output enable signal OE come from external, and performs a logic operation to generate the first signal LVS1. Since functions and operation method of the first gate channel set 200 of FIG. 4 are all similar to that of the embodiment of FIG. 3A, detailed operations thereof may refer to related descriptions of FIG. 3A, which are not repeated.

Figure 5:
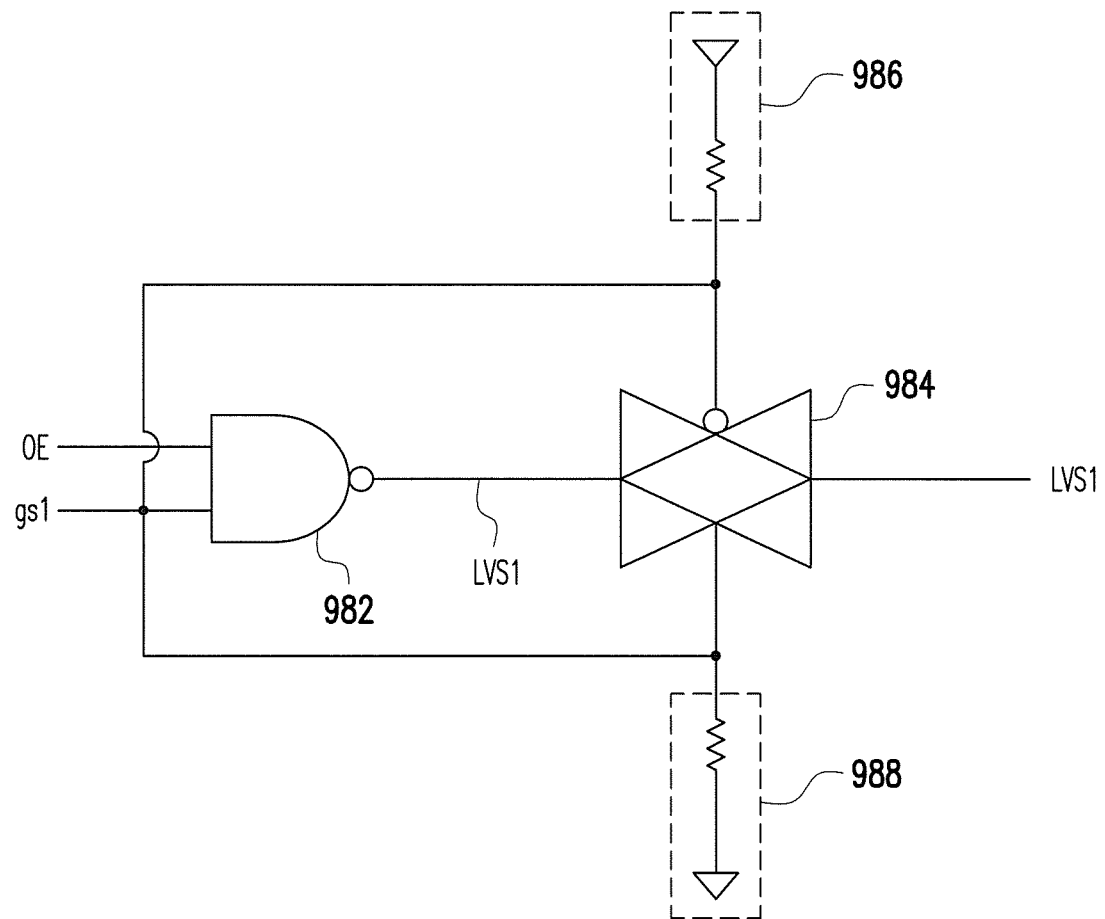
FIG. 5 is a circuit schematic diagram of a logic unit shown in FIG. 4.

In an embodiment of the invention, the logic units 231-23n of FIG. 4 can be implemented by an NAND gate and a transmission gate, as shown in FIG. 5. The logic unit 231 includes an NAND gate 982, a transmission gate 984, a pull-up power supply 986 and a pull-down power supply 988. An output terminal of the NAND gate 982 is coupled to an input terminal of the transmission gate 984. An output terminal of the transmission gate 984 serves as the output terminal of the logic unit 231 and is coupled to the input terminal of the first level shifter 202. An inverted control terminal of the transmission gate 984 is coupled to the pull-up power supply 986 and is controlled by the second delay start pulse gs1. A non-inverted control terminal of the transmission gate 984 is coupled to the pull-down power supply 988 and is controlled by the second delay start pulse gs1. The NAND gate 982 receives the output enable signal OE come from the external and the second delay start pulse gs1 to generate the first signal LVS1. When the second delay start pulse gs1 is a high impedance signal or is floating (i.e. the first switch 241 is turned off), the non-inverted control terminal of the transmission gate 984 is pulled down to the logic low level by the pull-down power supply 988 and the inverted control terminal is pulled up to the logic high level by the pull-up power supply 986, so that the output terminal of the transmission gate 984 has a high impedance state and does not output the first signal LVS1. Conversely, when the second delay start pulse gs1 has a logic high level, a level at the non-inverted control terminal of the transmission gate 984 is the logic high level, and the transmission gate 984 can transmit the first signal LVS1 to the input terminal of the first level shifter 202. When the second delay start pulse gs1 has a logic low level, the level at the inverted control terminal of the transmission gate 984 is the logic low level, and the transmission gate 984 can transmit the first signal LVS1 to the input terminal of the first level shifter 202.

Figure 6:
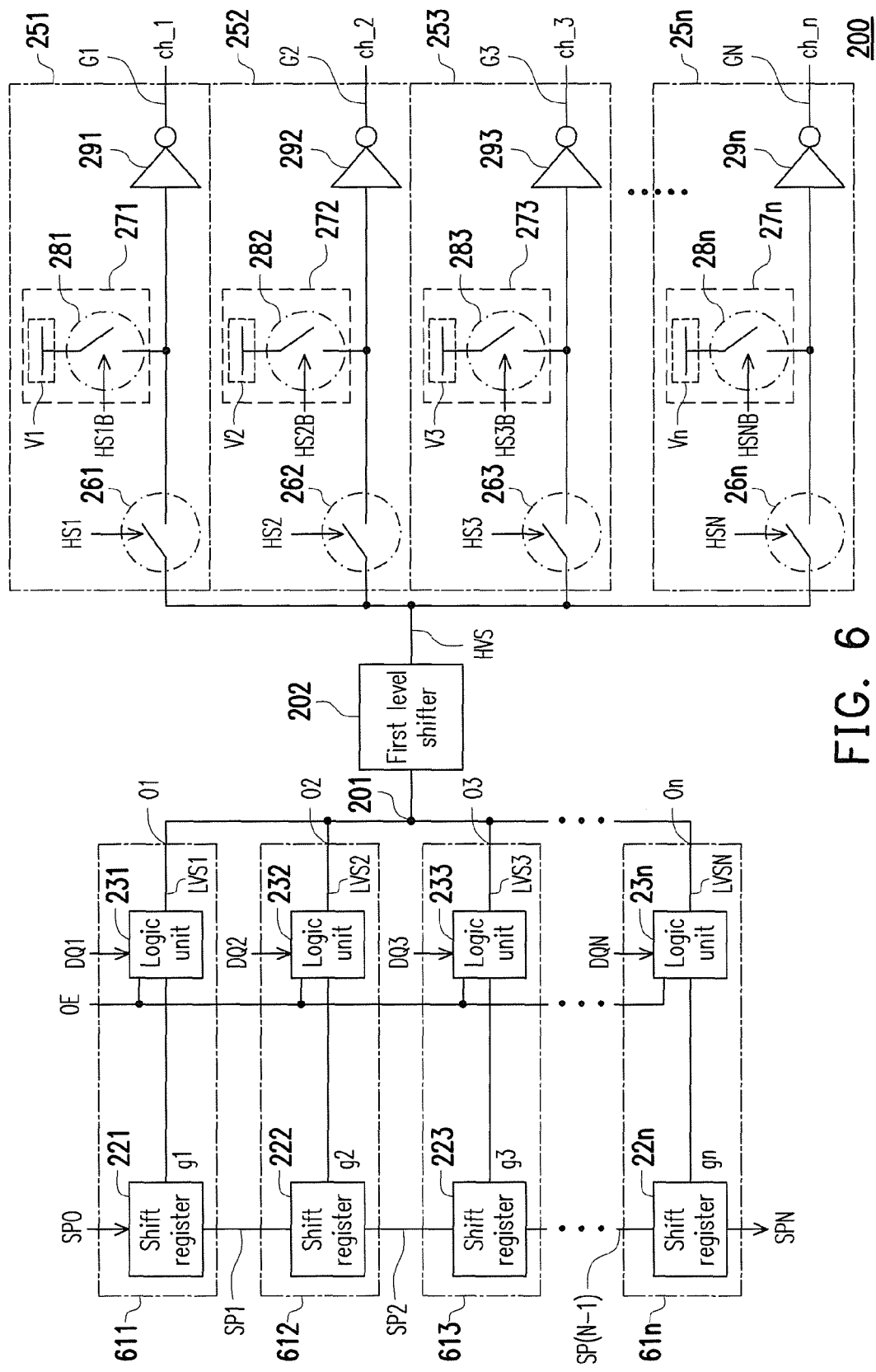
FIG. 6 is a circuit schematic diagram of a first gate channel set according to an embodiment of the invention.

Referring to FIG. 6, FIG. 6 is a circuit schematic diagram of the first gate channel set 200 of FIG. 2 according to still another embodiment of the invention. The embodiment of FIG. 6 can be deduced by referring to related descriptions of FIG. 3A and FIG. 3B. Compared to FIG. 3A, the logic units 231-23n of the front end channels 611, 612, 613, . . . , 61n of FIG. 6 respectively have a switch function, so that the first switches 241-24n shown in FIG. 3A can be omitted. In the present embodiment, the front end channels 611-61n substantially have the same (or similar) structure and functions. In the following descriptions, only the front end channel 611 of FIG. 6 is described, and descriptions of the other front end channels 612-61n can be deduced by referring to related descriptions of the front end channel 611.

The front end channel 611 includes the shift register 221 and the logic unit 231, where the shift register 221 receives the output pulse signal SP0 from the previous stage front end channel (not shown) to generate the first delay start pulse g1 and the output pulse signal SP1. An input terminal of the logic unit 231 is coupled to the shift register 221 for receiving the first delay start pulse g1. An output terminal of the logic unit 231 is coupled to the input terminal of the first level shifter 202. The logic unit 231 performs a logic operation on the first delay start pulse to generate the first signal LVS1 according to the output enable signal OE received from external. The logic unit 231 is controlled by the first control signal DQ1 to determine whether to output the first signal LVS1. When the logic unit 231 is turned on, the logic unit 231 outputs the first signal LVS1. Since functions and operation method of the first gate channel set 200 of FIG. 6 are all similar to that of the embodiment of FIG. 3A, detailed operations thereof may refer to related descriptions of FIG. 3A, which are not repeated.

Figure 7:
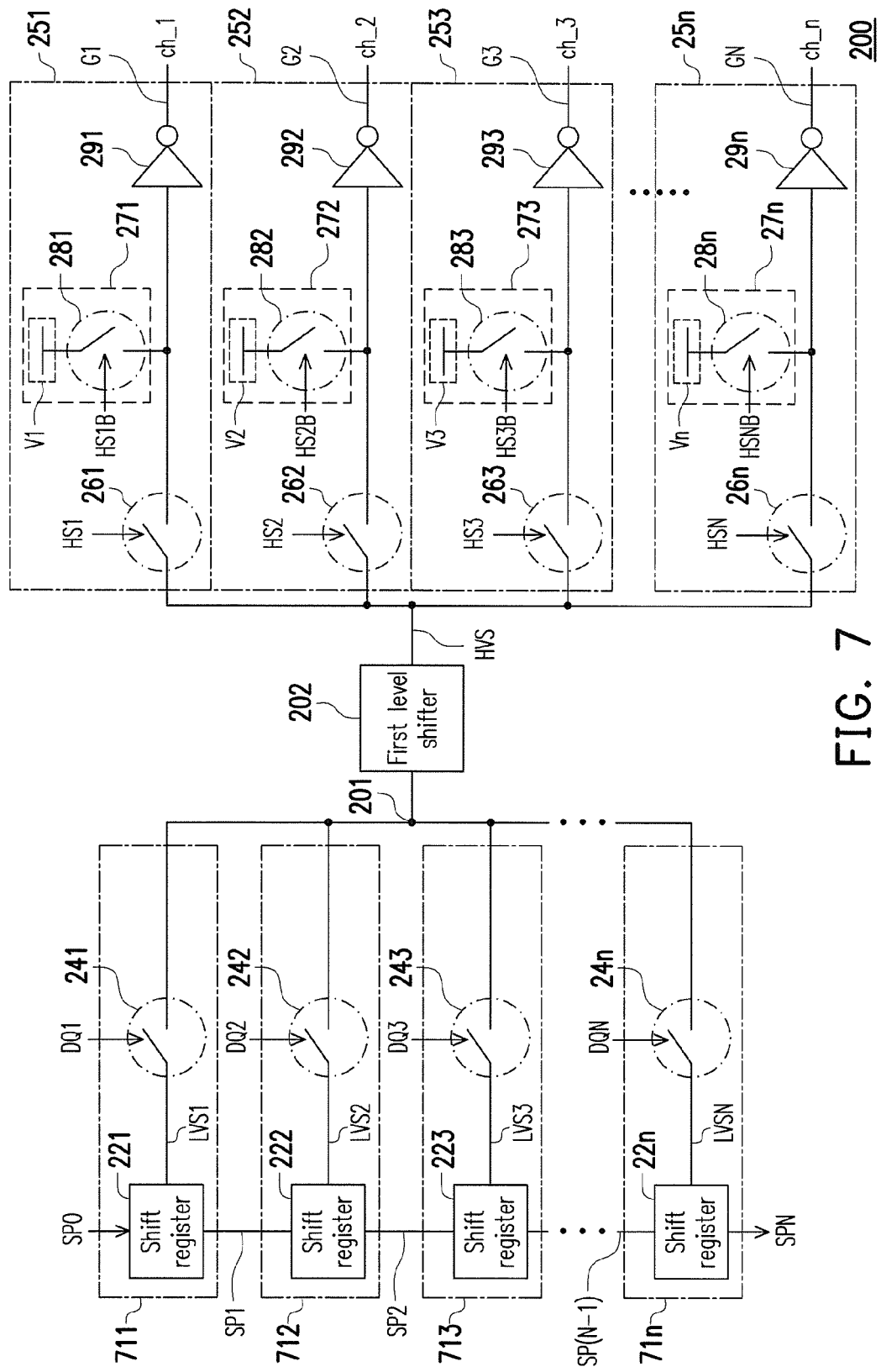
FIG. 7 is a circuit schematic diagram of a first gate channel set according to an embodiment of the invention.

Referring to FIG. 7, FIG. 7 is a circuit schematic diagram of the first gate channel set 200 of FIG. 2 according to yet another embodiment of the invention. The embodiment of FIG. 7 can be deduced by referring to related descriptions of FIG. 3A and FIG. 3B. Compared to FIG. 3A, in the front end channels 711, 712, 713, . . . , 71n of FIG. 7, the logic units are omitted. In the present embodiment, the front end channels 711-71n substantially have the same (or similar) structure and functions. In the following descriptions, only the front end channel 711 of FIG. 7 is described, and descriptions of the other front end channels 712-71n can be deduced by referring to related descriptions of the front end channel 711.

The front end channel 711 includes the shift register 221 and the first switch 241. The shift register 221 receives the output pulse signal SP0 from the previous stage front end channel (not shown) to generate the first signal LVS1. The first switch 241 is controlled by the first control signal DQ1 to determine a turning on/off state of the first switch 241. When the first switch 241 is turned on, the first signal LVS1 of the shift register 221 is transmitted to the input terminal of the level shifter 202. Since functions and operation method of the first gate channel set 200 of FIG. 7 are all similar to that of the embodiment of FIG. 3A, detailed operations thereof may refer to related descriptions of FIG. 3A, which are not repeated.

Figure 8:
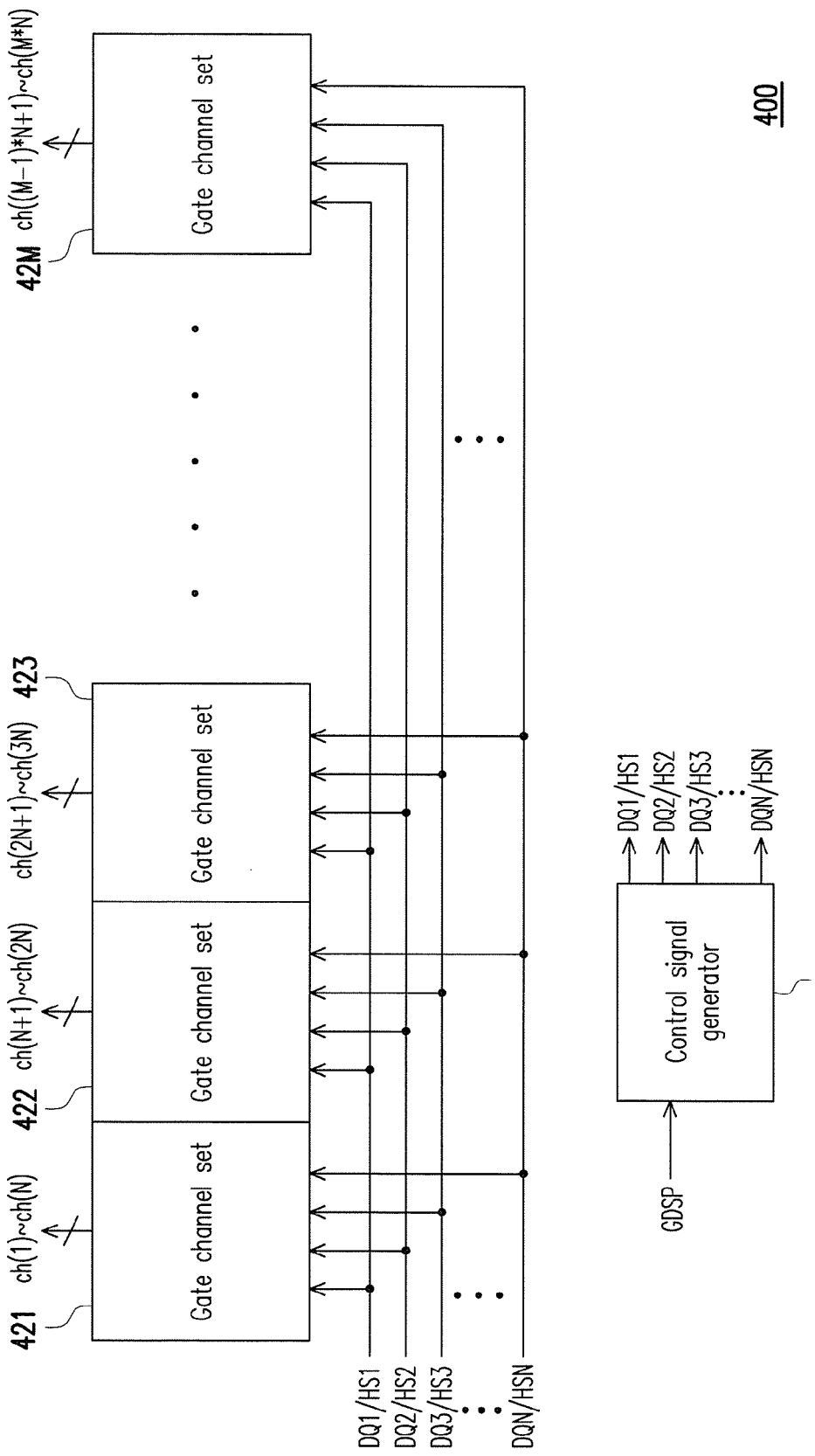
FIG. 8 is a circuit block diagram of a gate driving circuit according to an embodiment of the invention.

Referring to FIG. 8, FIG. 8 is a circuit block diagram of a gate driving circuit according to an embodiment of the invention. The embodiment of FIG. 8 can be deduced according to related descriptions of FIG. 2. The gate driving circuit 400 includes a control signal generator 410 and a plurality of gate channel sets 421-42M, where the control signal generator 410 receives the gate driver start pulse GDSP to generate a plurality of first control signals DQ1-DQN and a plurality of second control signals HS1-HSN, and transmits the first control signals DQ1-DQN and the second control signals HS1-HSN to each one of the gate channel sets 421, 422, 423, ..., 42M. Implementations of the gate channel sets 421-42M can be deduced according to related descriptions of FIG. 3A to FIG. 7. For example, in a circuit structure of each one of the gate channel sets 421-42M, N-stage gate channels share one level shifter. Since there are M gate channel sets, totally M*N gate channels are provided, though the M*N gate channels only use M level shifters, so as to achieve an effect of decreasing the number of the level shifters. It should be noticed that M can be an integer greater than 1, and the number M of the gate channel sets 421-42M is not limited by the invention. Moreover, the number N of the gate channels in each of the gate channel sets is not limited by the invention, i.e. the numbers of the first gate channels in the first gate channel sets can be different.

Besides, the M gate channel sets shown in FIG. 8 can be any permutation and combination of the gate channel sets of FIG. 1 (which are referred to as second gate channel sets) and the first gate channel sets shown in FIG. 3A, FIG. 4, FIG. 6 or FIG. 7. For example, the gate channel set 421 is the second gate channel set shown in FIG. 1, and the other gate channel sets 422-42M are the first gate channel sets shown in FIG. 3A, FIG. 4, FIG. 6 or FIG. 7. Alternatively, the gate channel sets 421, 423, etc. with odd referential numbers are the first channel sets 200 shown in FIG. 3A, FIG. 4, FIG. 6 or FIG. 7, and the gate channel sets with even referential numbers are the second gate channel sets shown in FIG. 1, which is not limited by the invention.

Moreover, each of the gate channel sets shown in FIG. 8 can be composed of the gate channels shown FIG. 1 (which are referred to as second gate channels) and the first gate channels shown in FIG. 3A, FIG. 4, FIG. 6 or FIG. 7 arranged in alternation or in a continuous manner, i.e. each of the gate channel sets is not limited to be composed of the first gate channels only or the second gate channels only. For example, a first to a fourth gate channels ch_1-ch_4 of the gate channel set 421 are the second gate channels shown in FIG. 1, and the other gate channels thereof are the first gate channels shown in FIG. 3A, FIG. 4, FIG. 6 or FIG. 7, which is not limited by the invention.

Figure 9:
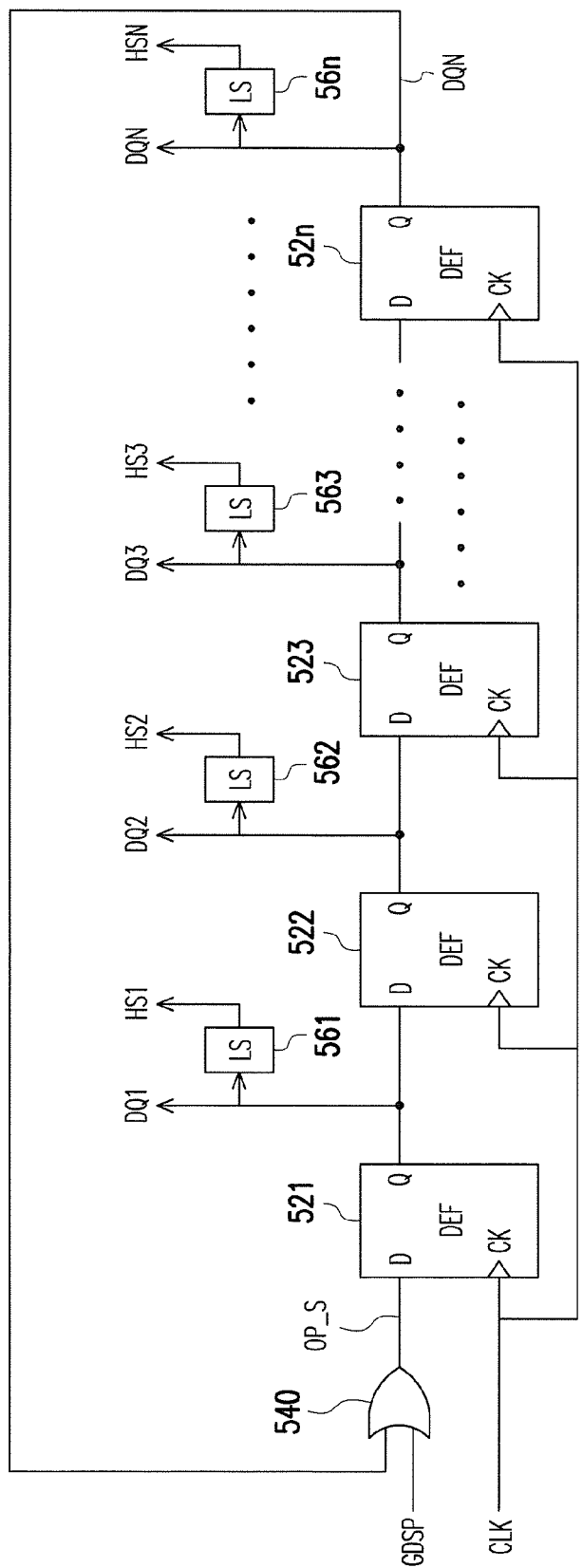
FIG. 9 is a circuit schematic diagram of a control signal generator of FIG. 8.

Referring to FIG. 9, FIG. 9 is a circuit schematic diagram of the control signal generator 410 of FIG. 2 or FIG. 7. The control signal generator 410 is used for providing the first control signals DQ1-DQN and the second control signals HS1-HSN shown in FIG. 3B. The control signal generator 410 includes a plurality of flip-flops (for example, D-type flip-flops 521, 522, 523, ..., 52n shown in FIG. 9), an OR gate 540 and a plurality of third level shifters (for example, level shifters 561, 562, 563, ..., 56n shown in FIG. 9). The D-type flip-flops 521-52n are used for generating a plurality of first control signals DQ1-DQN. Each of the D-type flip-flop has a clock terminal CK, an input terminal D and an output terminal Q. The clock terminal CK of each of the D-type flip-flops receives a clock signal CLK. The input terminal D of the first stage D-type flip-flop 521 in the D-type flip-flops 521-52n is coupled to an output terminal of the OR gate 540 for receiving an operation signal OP_S. The input terminal D of each of the D-type flip-flops 522-52n except the first stage D-type flip-flop 521 (for example, the third stage D-type flip-flop 523) is connected in series to the output terminal Q of the previous stage D-type flip-flop (for example, the second stage D-type flip-flop). A first input terminal of the OR gate 540 receives the gate driver start pulse GDSP. A second input terminal of the OR gate 540 is coupled to the output terminal Q of the last stage D-type flip-flop 52n in the flip-flops 521-52n for receiving the output signal DQN. The OR gate performs an OR operation to generate the operation signal OP_S. Input terminals of the third level shifters 561-56n are respectively coupled to the output terminals Q of the D-type flip-flops 521-52n to generate a plurality of second control signals HS1-HSN.

Figure 10:
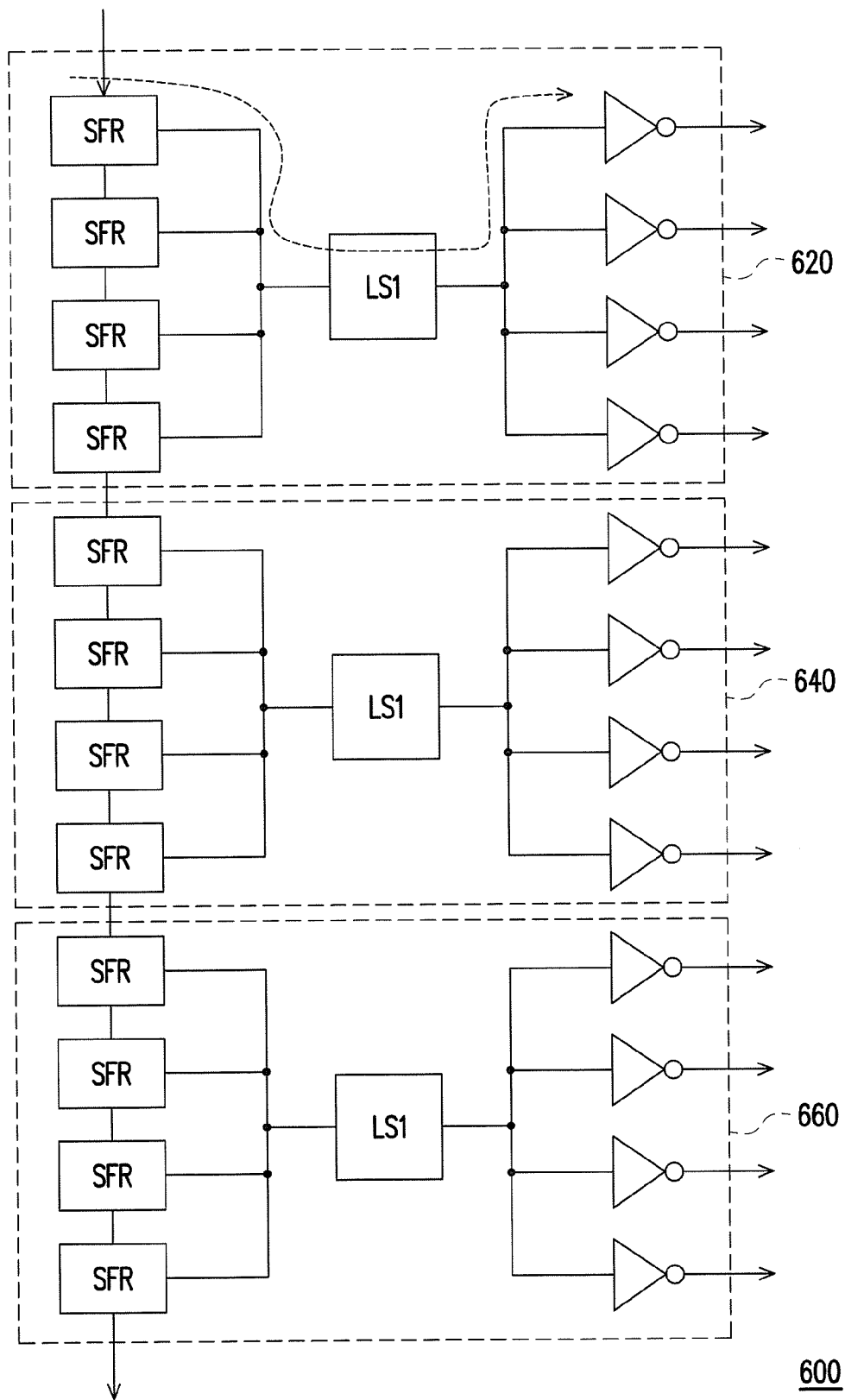
FIG. 10 is a schematic diagram of a gate driving circuit according to different embodiments of the invention.
Figure 11:
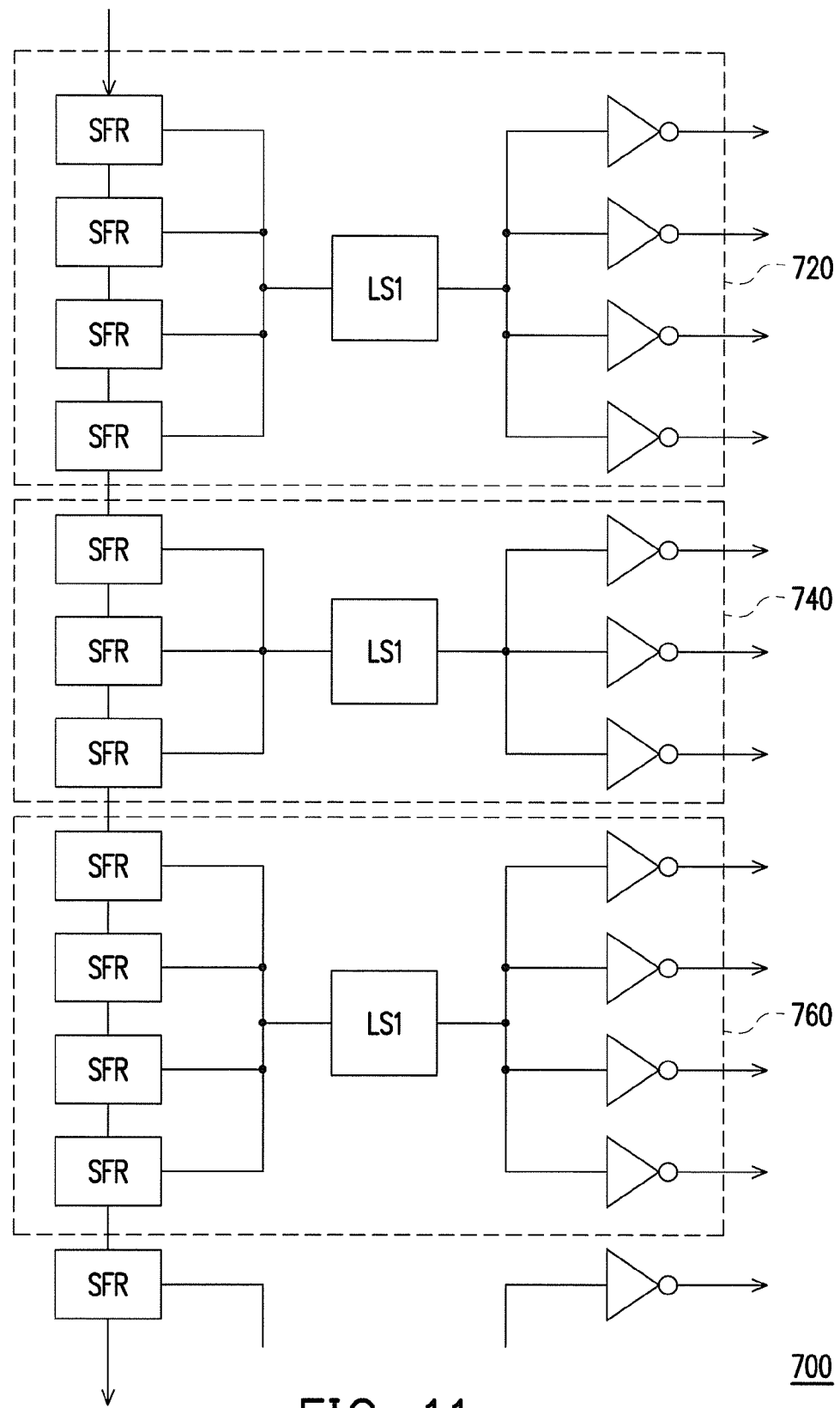
FIG. 11 is a schematic diagram of a gate driving circuit according to different embodiments of the invention.
Figure 12:
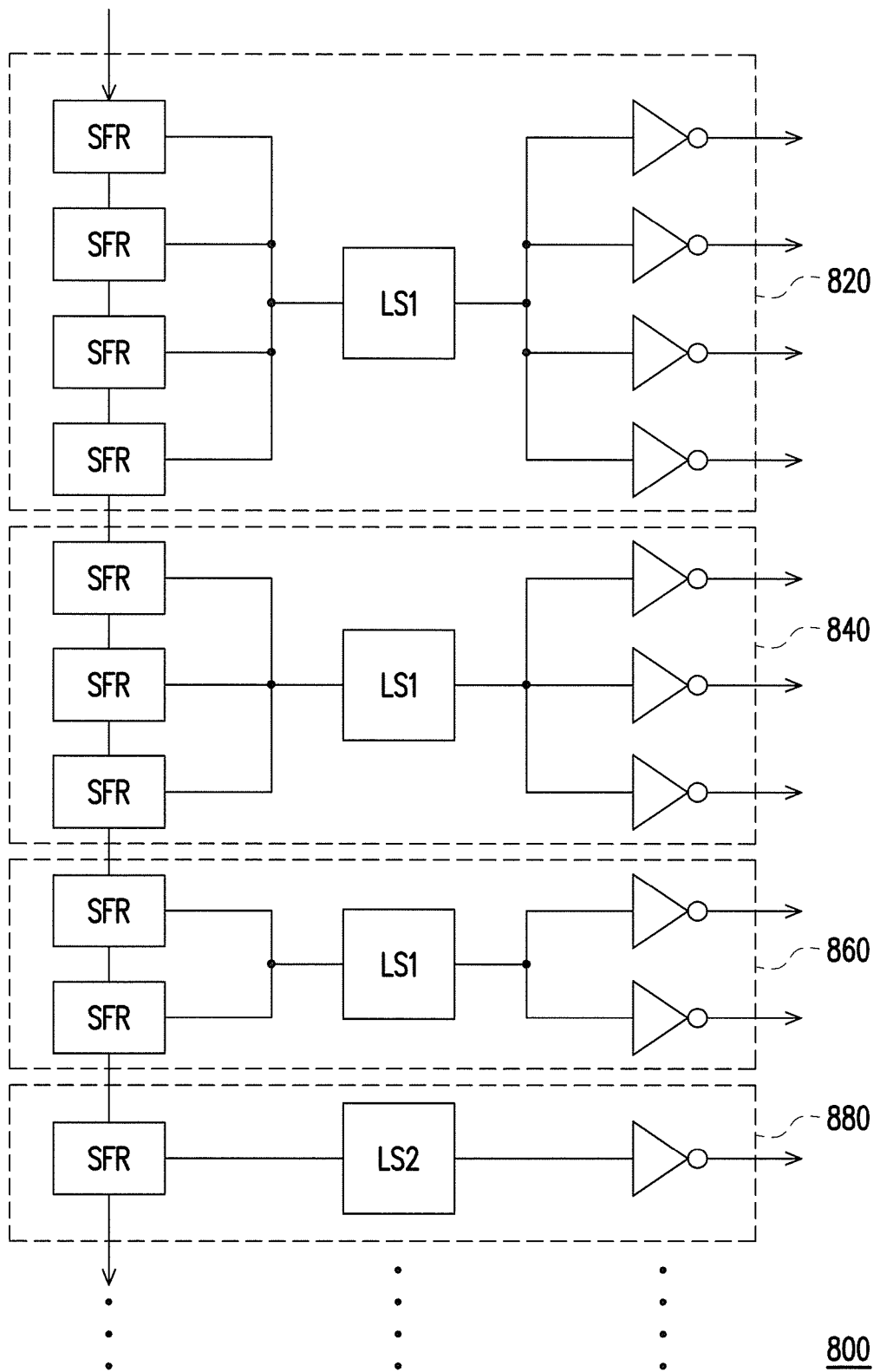
FIG. 12 is a schematic diagram of a gate driving circuit according to different embodiments of the invention.

FIG. 10-FIG. 12 are schematic diagrams of the gate driving circuit according to different embodiments of the invention. For simplicity's sake, in the embodiments of FIG. 10-FIG. 12, SFR is used to represent each front end channel, and an inverter symbol is used to represent each post end channel. The front end channels SFR of FIG. 10-FIG. 12 can be deduced by referring to related descriptions of the front end channels 211-21n shown in FIG. 3A, the front end channels 411-41n shown in FIG. 4, the front end channels 611-61n shown in FIG. 6, and/or the front end channels 711-71n shown in FIG. 7. The post end channels (i.e. the inverter symbols shown in FIG. 10-FIG. 12) of FIG. 10-FIG. 12 can be deduced by referring to related descriptions of the post end channels 251-25n shown in FIG. 3A.

The gate driving circuit 600 shown in FIG. 10 can be deduced by referring to related descriptions of the gate driving circuit 930 of FIG. 2 and the gate driving circuit 400 of FIG. 8. In the embodiment of FIG. 10, the gate driving circuit 600 has three or more first gate channel sets (for example, the first gate channel sets 620, 640 and 660 shown in FIG. 10). The first gate channel sets 620, 640 and 660 respectively have four first gate channels, and the four first gate channels share a first level shifter LS1.

The gate driving circuit 700 shown in FIG. 11 can be deduced by referring to related descriptions of the gate driving circuit 930 of FIG. 2 and the gate driving circuit 400 of FIG. 8. In the embodiment of FIG. 11, the gate driving circuit 600 has three or more first gate channel sets (for example, the first gate channel sets 720, 740 and 760 shown in FIG. 11). The first gate channel sets 720, 740 and 760 respectively have a different number of the gate channels. For example, the first gate channel set 720 has four first gate channels, the first gate channel set 740 has three first gate channels, and the first gate channel set 760 has four first gate channels. The four first gate channels of the first gate channel set 720 share a first level shifter LS1, the three first gate channels of the first gate channel set 740 share a first level shifter LS1, and the four first gate channels of the first gate channel set 760 share a first level shifter LS1.

The gate driving circuit 800 shown in FIG. 12 can be deduced by referring to related descriptions of the gate driving circuit 930 of FIG. 2 and the gate driving circuit 400 of FIG. 8. In the embodiment of FIG. 12, the gate driving circuit 800 has four or more gate channel sets (for example, the gate channel sets 820, 840, 860 and 880 shown in FIG. 12). The gate channel sets 820, 840, 860 and 880 respectively have a different number of the gate channels. For example, the first gate channel set 820 has four first gate channels, the first gate channel set 840 has three first gate channels, the first gate channel set 860 has two first gate channels, and the second gate channel set 880 has one second gate channel. The four first gate channels of the first gate channel set 820 share a first level shifter LS1, the three first gate channels of the first gate channel set 840 share a first level shifter LS1, the two first gate channels of the first gate channel set 860 share a first level shifter LS1, and the one second gate channel of the second gate channel set 880 uses one second level shifter LS2.

Besides, an embodiment of the invention further provides a driving method of a gate driving circuit, where the gate driving circuit is used for generating a plurality of gate driving signals. The gate driving circuit includes a control signal generator and at least one gate channel set. Each of the at least one first gate channel set includes a plurality of first gate channels. The driving method of the gate driving circuit includes following steps. A plurality of first control signals and a plurality of second control signals are generated according to a gate driver start pulse, and the first gate channels of a same first gate channel set are determined to share a first level shifter in time-division according to the first control signals and the second control signals, so as to generate the gate driving signals. In some embodiments, when one of the first gate channels uses the first level shifter during the aforementioned time period, the gate driving signal of each of the other first gate channels is hold to a voltage level.

In summary, in the embodiment of the invention, the gate driving circuit is grouped into at least one group, and each group includes a plurality of gate channels to construct a gate channel set. All of or a part of the gate channels belonging to the same gate channel set may share a level shift. In this way, in the gate driving circuit including at least one gate channel set, the number of the used level shifters is decreased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A gate driving circuit, comprising:
    a control signal generator, receiving a gate driver start pulse to generate a plurality of first control signals and a plurality of second control signals; and
    at least one first gate channel set, coupled to the control signal generator, wherein each of the at least one first gate channel set comprises a plurality of first gate channels, and the first gate channels are controlled by the first control signals and the second control signals to share a first level shifter, and generate a plurality of gate driving signals.

2. The gate driving circuit as claimed in claim 1, wherein the first gate channels comprise:
    the first level shifter;
    a plurality of front end channels, respectively having a driving signal output terminal coupled to an input terminal of the first level shifter, wherein the front end channels are connected in series to respectively receive an output pulse signal of a previous stage front end channel in the front end channels, and each of the front end channels is controlled by one of the first control signals to determine whether to output a first signal to the input terminal of the first level shifter; and
    a plurality of post end channels, respectively having an input terminal coupled to an output terminal of the first level shifter, wherein each of the post end channels is controlled by one of the second control signals to determine whether to generate one of the gate driving signals according to an output signal of the first level shifter.

3. The gate driving circuit as claimed in claim 2, wherein under control of the second control signals, one of the post end channels receives the output signal of the first level shifter to correspondingly generate one of the gate driving signals, and the other post end channels hold the other gate driving signals to a voltage level.

4. The gate driving circuit as claimed in claim 2, wherein each of the front end channels comprising:
    a shift register, receiving the output pulse signal from the previous stage front end channel to generate a first delay start pulse;
    a logic unit, having an input terminal coupled to the shift register for receiving the first delay start pulse, wherein the logic unit performs a logic operation and generates the first signal according to an output enable signal come from external; and
    a first switch, having a first terminal coupled to an output terminal of the logic unit for receiving the first signal, and a second terminal coupled to the input terminal of the first level shifter, wherein the first switch is controlled by a corresponding one of the first control signals.

5. The gate driving circuit as claimed in claim 2, wherein each of the front end channels comprises:
    a shift register, receiving the output pulse signal from the previous stage front end channel to generate a first delay start pulse;
    a first switch, having a first terminal coupled to the shift register for receiving the first delay start pulse, wherein the first switch is controlled by a corresponding one of the first control signals to output the first delay start pulse to serve as a second delay start pulse; and
    a logic unit and, having an input terminal coupled to a second terminal of the first switch for receiving the second delay start pulse, and an output terminal coupled to the input terminal of the first level shifter, wherein the logic unit performs a logic operation to the second delay start pulse to generate the first signal according to an output enable signal come from external.

6. The gate driving circuit as claimed in claim 2, wherein each of the front end channels comprises:
    a shift register, receiving the output pulse signal from the previous stage front end channel to generate a first delay start pulse; and
    a logic unit, having an input terminal coupled to the shift register for receiving the first delay start pulse, and an output terminal coupled to the input terminal of the first level shifter, wherein the logic unit performs a logic operation to the first delay start pulse to generate the first signal according to an output enable signal come from external, and the logic unit is controlled by a corresponding one of the first control signals to determine whether to output the first signal.

7. The gate driving circuit as claimed in claim 2, wherein each of the front end channels comprises:
    a shift register, receiving the output pulse signal from the previous stage front end channel to generate the first signal; and
    a first switch, having a first terminal coupled to the shift register for receiving the first signal, and a second terminal coupled to the input terminal of the first level shifter, wherein the first switch is controlled by a corresponding one of the first control signals.

8. The gate driving circuit as claimed in claim 2, wherein each of the post end channels comprises:
- a second switch, having a first terminal coupled to the output terminal of the first level shifter, wherein the second switch is controlled by a corresponding one of the second control signals; and
- a driving voltage holding circuit, having an output terminal coupled to a second terminal of the second switch,
- wherein when the second switch is turned off, the driving voltage holding circuit holds a corresponding one of the gate driving signals to a voltage level, and when the second switch is turned on, the second switch outputs the output signal of the first level shifter to serve as the corresponding one of the gate driving signals.

9. The gate driving circuit as claimed in claim 8, wherein the driving voltage holding circuit comprises:
- a voltage source; and
- a third switch, having a first terminal coupled to the second terminal of the second switch, and a second terminal coupled to the voltage source, wherein the third switch is controlled by an inverted signal of the corresponding one of the second control signals.

10. The gate driving circuit as claimed in claim 9, wherein the voltage source is a ground voltage source or an operation voltage source.

11. The gate driving circuit as claimed in claim 8, wherein the driving voltage holding circuit comprises:
- a voltage source; and
- a capacitor, having a first end coupled to the second terminal of the second switch, and a second end coupled to the voltage source.

12. The gate driving circuit as claimed in claim 8, wherein each of the post end channels further comprises:
- an output buffer, having an input terminal coupled to the second terminal of the second switch.

13. The gate driving circuit as claimed in claim 12, wherein the output buffer comprises at least one inverter.

14. The gate driving circuit as claimed in claim 1, wherein the control signal generator comprises:
- an OR gate, having a first input terminal receiving the gate driver start pulse;
- a plurality of flip-flops, generating the first control signals, a clock terminal of each of the flip-flops receiving a clock signal, an input terminal of a first stage flip-flop of the flip-flops being coupled to an output terminal of the OR gate, and an input terminal of each of the flip-flops except the first stage flip-flop is coupled to an output terminal of a previous stage flip-flop of the flip-flops, wherein a second input terminal of the OR gate is coupled to an output terminal of a last stage flip-flop of the flip-flops; and
- a plurality of third level shifters, wherein an input terminal of each of the third level shifters is coupled to the output terminal of a corresponding one of the flip-flops to generate one of the second control signals.

15. The gate driving circuit as claimed in claim 1, wherein numbers of the first gate channels in the at least one first gate channel set are different to each other.

16. The gate driving circuit as claimed in claim 1, wherein each of the at least one first gate channel set further has at least one second gate channel, and each of the at least one second gate channel has a non-shared second level shifter.

17. The gate driving circuit as claimed in claim 1, further comprising:
- at least one second gate channel set,
- wherein each of the at least one second gate channel set comprises at least one second gate channel, and each of the at least one second gate channel has a non-shared second level shifter.

18. A driving method of a gate driving circuit, comprising:
- generating a plurality of first control signals and a plurality of second control signals according to a gate driver start pulse; and
- determining a plurality of first gate channels of a first gate channel set to share a first level shifter in time-division according to the first control signals and the second control signals, so as to generate a plurality of gate driving signals.

19. The driving method of the gate driving circuit as claimed in claim 18, wherein when one of the first gate channels uses the first level shifter during a time period, the gate driving signal of each of the other first gate channels is held to a voltage level.

\* \* \* \* \*